(12) United States Patent
Sigel et al.

(10) Patent No.: US 7,446,297 B1
(45) Date of Patent: Nov. 4, 2008

(54) SENSOR AND METHOD FOR PROVIDING HIGH TRANSFER RATE IN PAGE-BASED OPTICAL DATA STORAGE

(75) Inventors: Christophe N. Sigel, Broomfield, CO (US); Michael L. Leonhardt, Longmont, CO (US)

(73) Assignee: Storage Technology Corporation, Louisville, CO (US)

( * ) Notice: Subject to any disclaimer, the term of this patent is extended or adjusted under 35 U.S.C. 154(b) by 71 days.

(21) Appl. No.: 11/447,569

(22) Filed: Jun. 6, 2006

(51) Int. Cl.
*H01L 31/00* (2006.01)

(52) U.S. Cl. .................. 250/214.1; 250/214 R; 257/431; 257/436; 359/247; 359/248

(58) Field of Classification Search ................ 359/245, 359/247, 242, 248, 252, 278, 290, 291, 298, 359/315, 318; 250/214.1, 214 R; 257/431, 257/434, 436, 437
See application file for complete search history.

(56) References Cited

U.S. PATENT DOCUMENTS

| | | | |
|---|---|---|---|
| 5,488,504 A * | 1/1996 | Worchesky et al. | 359/248 |
| 5,900,965 A * | 5/1999 | Matkin et al. | 359/283 |
| 6,380,531 B1 | 4/2002 | Sugihwo et al. | |
| 7,045,833 B2 * | 5/2006 | Campbell et al. | 257/186 |
| 2002/0051419 A1 * | 5/2002 | Itoh et al. | 369/103 |
| 2005/0263805 A1 | 12/2005 | Mouli | |

OTHER PUBLICATIONS

Toishi et al.; "Temperature Tolerance Improvement With Wavelength Tuning Laser Source In Holographic Data Storage"; ThE5 (3 pages).

Burr et al.; "Modulation Coding For Pixel-Matched Holographic Data Storage"; May 1, 1997 / vol. 22, No. 9 / Optics Letters (pp. 639-641).

Nicolas Blanc; "CCD versus CMOS—has CCD imaging come to an end?"; Photogrammetric Week '01, D. Fritsch & R. Spiller, Eds., Wichmann Verlag, Heidelberg, 2001 (pp. 131-137).

Geoffrey W. Burr; "Holographic Storage"; Encyclopedia of Optical Engineering; DOI: 10.1081/E-EOE 120009577 (pp. 710-734).

Kurt W. Getreuer; "Optical Disk Drives-Mechanical Design and Servo Systems"; Encyclopedia of Optical Engineering, DOI: 10.1081/E-EOE 120009665 (pp. 1653-1666).

Schleipen et al.; "Optical Heads"; Encyclopedia of Optical Engineering, DOI: 10.1081/E-EOE 120009664 (pp. 1667-1693).

Zhang et al.; "Multi-Layer Optical Data Storage Based On Two-Photon Recordable Fluorescent Disk Media"; Call/Recall, Inc. (pp. 225-236).

Ünlü et al.; Resonant Cavity Enhanced Photonic Devices; J. Appl. Phys. 78 (2), Jul. 15, 1995 (pp. 607-639).

* cited by examiner

*Primary Examiner*—Georgia Y. Epps
*Assistant Examiner*—Francis M Legasse, Jr.
(74) *Attorney, Agent, or Firm*—Brooks Kushman P.C.

(57) ABSTRACT

A sensor and method for page-based optical data storage. The sensor includes a partially-reflective mirror, a reflective mirror disposed substantially collinear with and spaced apart from the partially-reflective mirror, and an active layer disposed substantially collinear with and between the partially-reflective mirror and the reflective mirror. The partially-reflective mirror has a first and second side and transmits a portion of light incident on the first side. The reflective mirror reflects light incident on the reflective mirror toward the partially-reflective mirror. The active layer absorbs at least a portion of the light oscillating at the resonant frequency.

5 Claims, 3 Drawing Sheets

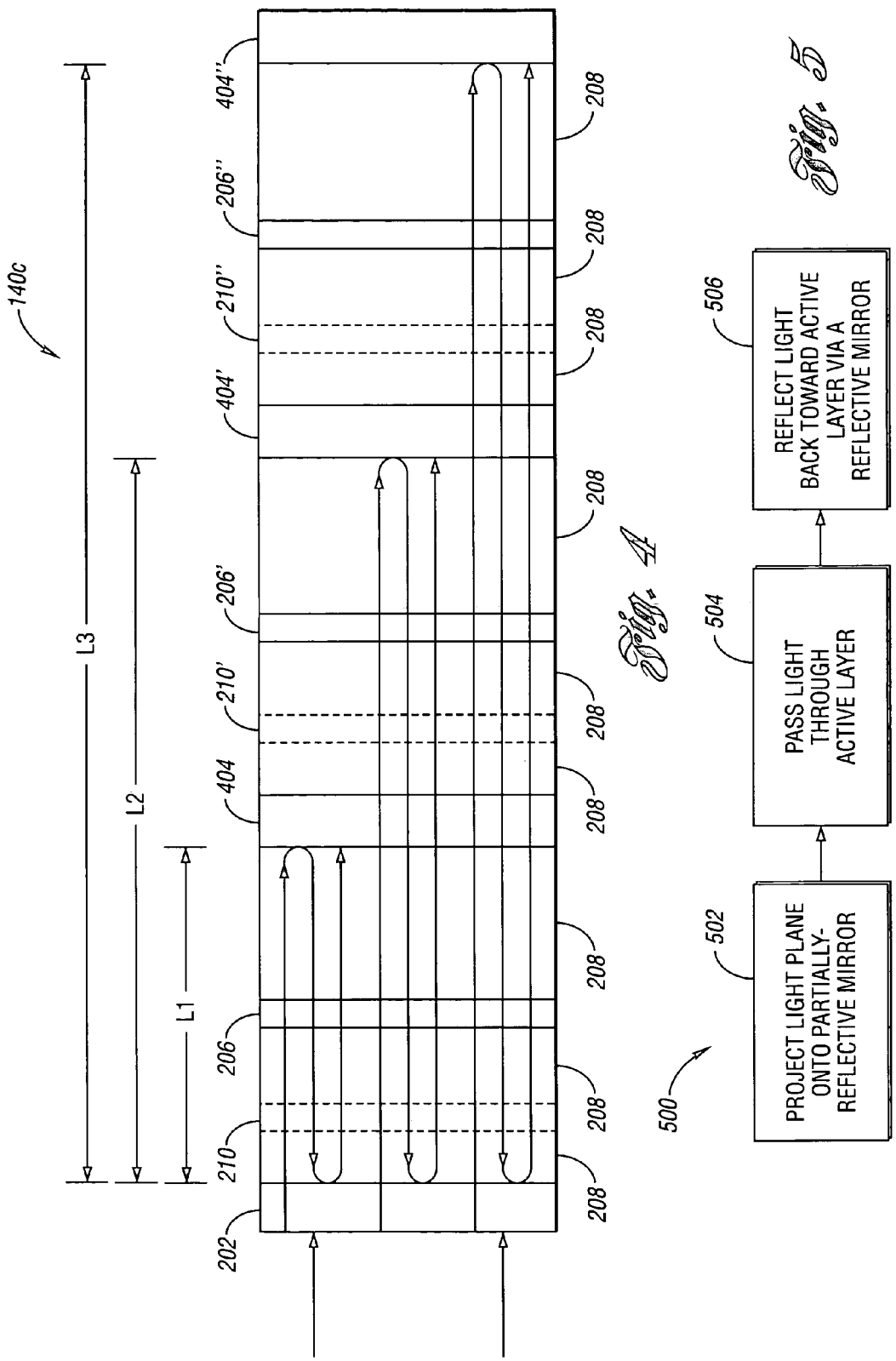

SENSOR AND METHOD FOR PROVIDING HIGH TRANSFER RATE IN PAGE-BASED OPTICAL DATA STORAGE

BACKGROUND OF THE INVENTION

1. Field of the Invention

The present invention relates to page-based optical data storage and, in particular, to a sensor and method for providing increased transfer rates in page-based optical data storage.

2. Background Art

Traditional optical data storage technologies (e.g., CD and DVD) lag behind traditional magnetic data storage technologies (e.g., hard drives and tape) in transfer rates. Page-based optical data storage and retrieval offers the advantage of parallel optical data processing and may generally enable higher data transfer rates.

In page-based optical data storage, a page of data is read by imaging a two-dimensional data page onto a two-dimensional detector. The detector detects the image, and the image is subsequently processed to decode the data contained therein. In general, the detector comprises an active (i.e., absorbing) layer for detecting the image of the two-dimensional data page.

Page-based optical data storage technologies and, in particular, holographic data storage (HDS), have benefited greatly from the recent development of low cost complementary metal oxide semiconductor (CMOS) active pixel digital image sensors (also known as APS detectors), such as the ones available today in high resolution digital cameras. These sensors, compared to traditional charge-coupled device (CCD) detectors, present the advantages of lower unit cost (due to the simpler design and manufacturing) and design flexibility provided by the CMOS process, allowing more functionality to be included in the detector chip. However, these sensors have invariably been optimized for the high dynamic range and relatively low transfer rates required by consumer imaging and machine vision applications, not for data storage.

Recent efforts to increase the transfer rate have focused on improvements to the back-end (i.e., off-chip) electronic transfer and processing architecture of the detector. Major advances include the implementation of increasingly complex multi-element active pixel structures having multiple transistors and memory elements for improving signal to noise ratio and enabling parallel integration and readout. The incorporation of multiple parallel output amplifiers has increased the electronic output from the image sensor. While such techniques have yielded substantial improvements in the frame transfer rates, they do not improve the optical properties of the sensor and sometimes contribute to their degradation. For example, the integration of a greater number of electronic circuitry tends to reduce the photoactive area in each pixel, otherwise termed its fill factor, and thus contributes to reducing optical detection efficiency. Furthermore, there exists a general trade-off between bandwidth and sensitivity of a photo sensor, both being dependent on the thickness of the active layer of the detector. In particular, as the thickness of the active layer decreases, the detector bandwidth increases but the detector sensitivity and also the detector signal to noise ratio generally decrease.

Background information may be found in Geoffrey W. Burr, Holographic Storage, Encyclopedia of Optical Engineering, Marcel Dekker, Inc., 2003; Geoffrey W. Burr et al., Modulation Coding For Pixel-Matched Holographic Data Storage, Optical Letters, Vol. 22, No. 9, Optical Society Of America, 1997; Nicolas Blanc, CCD versus CMOS—has CCD imaging come to an end?, Photogrammetric Week '01', D. Fritsch and R. Spiller Eds. Wichmann Verlag, Heidelberg, 2001; and Jean Schleipen et al., Optical Heads, Encyclopedia Of Optical Engineering, Marcel Dekker, Inc., 2003.

Accordingly, it may be desirable to have a sensor (i.e., detector) and/or method for providing greater sensitivity without requiring an increase in thickness of a corresponding photoactive area.

SUMMARY OF THE INVENTION

The present invention generally contemplates encapsulating the active area of each pixel of a sensor array (i.e., detector) within a resonant cavity formed by two reflective surfaces. Encapsulation of the active area of each pixel generally increases the absorption due to the multiple passes and resulting enhancement of the optical field through the active layer. Accordingly, increased detector sensitivity may be achieved. Additionally, incorporation of a resonant cavity makes it possible to employ thinner active layer for each pixel without reducing the sensitivity of the sensor array. Furthermore one or more embodiments of the present invention may provide a mechanism for controlling and varying the resonant properties of the cavity, for effectively forming a tunable frequency selective resonant cavity enhanced sensor. Furthermore, one or more embodiments of the present invention may provide, inter alia, for separation of wavelength multiplexed images in holographic storage.

According to an embodiment of the present invention, then, a sensor for page-based optical data storage is provided. The sensor comprises a partially-reflective mirror, a reflective mirror disposed substantially collinear with and spaced apart from the partially-reflective mirror, and an active layer disposed substantially collinear with and between the partially-reflective mirror and the reflective mirror. The partially-reflective mirror has a first and second side and transmits a portion of light incident on the first side. The reflective mirror reflects light incident on the reflective mirror toward the partially-reflective mirror. The active layer absorbs at least a portion of the light oscillating at the resonant frequency.

According to another embodiment of the present invention, a sensor for page-based optical data storage is provided. The sensor comprises a first partially-reflective mirror, a second partially-reflective mirror disposed substantially collinear with and spaced apart from the first partially-reflective mirror, a first active layer disposed substantially collinear with and between the first and second partially-reflective mirrors, a third partially-reflective mirror disposed substantially collinear with and spaced apart from the second partially-reflective mirror, and a second active layer disposed substantially collinear with and between the second and third partially-reflective mirrors. The first partially-reflective mirror has a first and second side and transmits a portion of light incident on the first side. The second partially-reflective mirror has a first and second side and reflects light oscillating with a first frequency and transmits light not oscillating with the first frequency. The first active layer is configured to absorb at least a portion of the light oscillating with the first frequency. The third partially-reflective mirror has a first and second side and reflects light oscillating with a second frequency and transmits light not oscillating with the second frequency. The second active layer is configured to absorb at least a portion of the light oscillating with the second frequency.

According to yet another embodiment of the present invention, a method for retrieving data in page-based optical data storage is provided. The method comprises projecting a light plane of modulated signals corresponding to the data onto a first side of a partially-reflective mirror. The partially-reflective mirror is configured to transmit a portion of the light plane. The method further comprises passing the portion of the light plane transmitted by the partially-reflective mirror through an active layer disposed substantially collinear with and spaced apart from the partially-reflective mirror such that a portion of light oscillating at a first frequency is absorbed by the active layer and light not absorbed by the active layer is transmitted through the active layer, and reflecting light transmitted through the active layer back toward the active layer via a reflective mirror disposed substantially collinear with and spaced apart from the active layer such that a second portion of the light oscillating at the first frequency is absorbed by the active layer and light not absorbed by the active layer is transmitted through the active layer toward the partially-reflective mirror.

BRIEF DESCRIPTION OF THE DRAWINGS

FIG. 4 is a schematic diagram of a sensor according to still at least one other embodiment of the present invention; and FIG. 5 is a flow diagram of a method for retrieving data in page-based optical data storage.

DETAILED DESCRIPTION

One or more embodiments of the present invention are now described with reference to the Figures, where like reference numbers indicate like elements.

Figure 1:
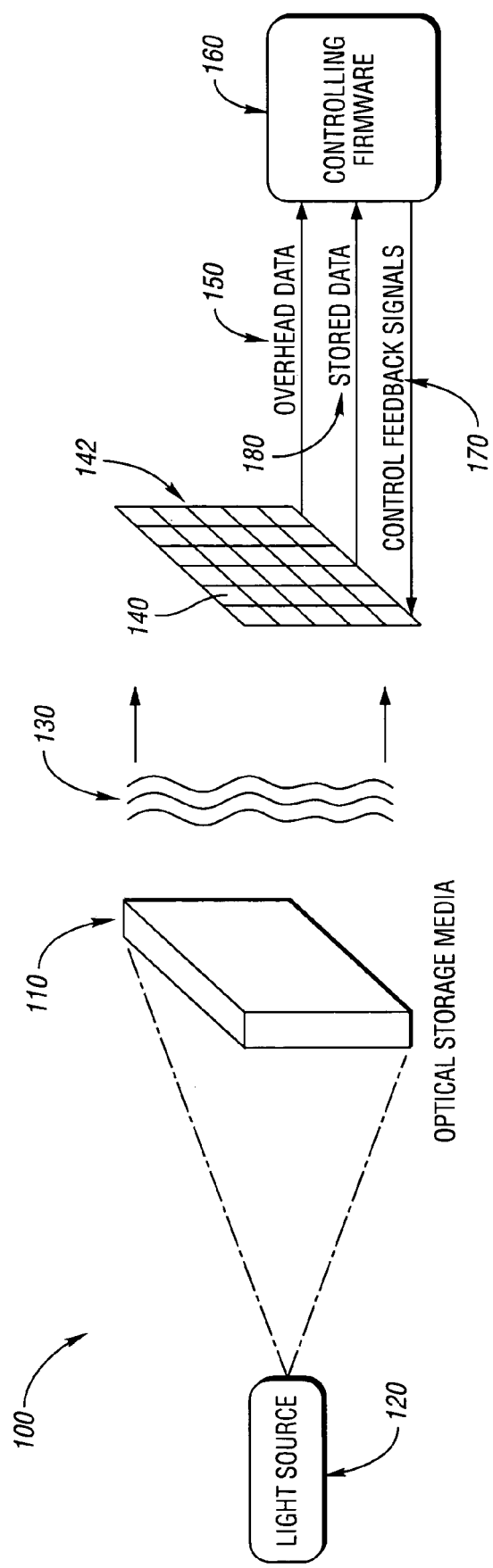
FIG. 1 is a high-level schematic diagram of a readout operation for a page-based optical data storage system according to one or more embodiments of the present invention.

FIG. 1 is a high-level schematic diagram of a readout operation for a page-based optical data storage system 100 (e.g., implemented holographically, diffractively, etc.) according to one or more embodiments of the present invention. Optical medium 110 is generally illuminated by light source 120, providing a plane 130 of modulated signals representing the stored data. The modulated signals are detected by the photodetector array (i.e., sensor array) 142. The photodetector array 142 generally further comprises a plurality of pixels (i.e., sensors) 140.

From the photodetector array 142, data 180 is transferred out to the controlling firmware 160 and/or other logical apparatus. Depending on the level of integration of additional functionality on the photodetector array, other electronic signals 150, potentially representing servo alignment data, or other types of data obtained through on-chip processing such local signal to noise ratio, may also be transferred out to the controlling firmware 160 and/or other suitable component of the system 100. The controlling firmware 160 may transmit control feedback signals 170 to the photodetector array 142, directing the photodetector array 142 on how to adjust one or more optical detection parameter, error correction parameter, and/or the like.

It should be understood that while a preferred embodiment of the present invention may include a CMOS based active pixel sensor, any appropriate photodetector array sensor technology may be implemented to satisfy the design criteria of a particular application.

Figure 2:
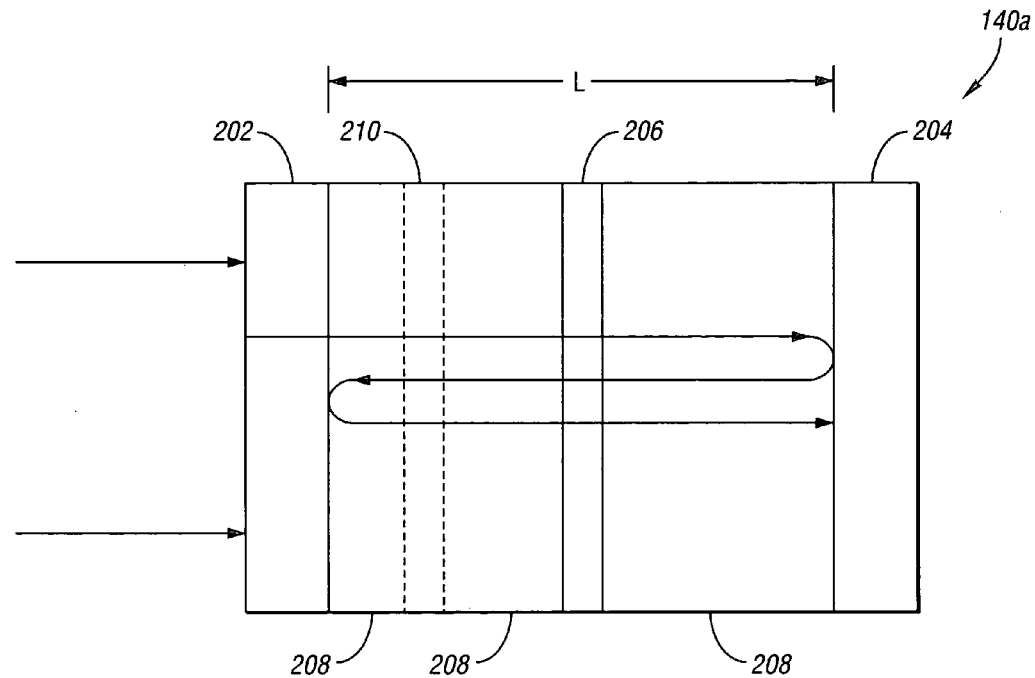
FIG. 2 is a schematic diagram of a sensor according to at least one embodiment of the present invention.

Referring to FIG. 2, a schematic diagram is provided of an individual pixel sensor 140a of a sensor array 142 according to at least one embodiment of the present invention. More specifically, only the active area of the pixel sensor 140a is represented. The structure of the active area of pixel sensor 140a may be configured to provide increased quantum efficiency as compared to that of a conventional sensor array. The active area of pixel sensor 140a generally comprises a partially-reflective mirror 202, a reflective mirror 204, an active (i.e., absorbing) layer 206, and/or one or more spacer layers 208. As illustrated in FIG. 2, the pixel sensor 140a may also comprise a layer 210 of a controllable refractive index material, hereafter also termed controllable index layer 210. In general, the partially-reflective mirror 202, reflective mirror 204, active layer 206, spacer layer 208, and/or controllable index layer 210 may cooperate to form a resonant cavity enhanced pixel sensor.

The partially-reflective mirror 202 is generally configured to partially transmit light incident on a first side of the mirror 202. The partially-reflective mirror 202 may comprise a plurality of quarter wave thick alternating layers of materials with suitably different index of refraction, but may also be fabricated using any appropriately partially reflective material to meet the design criteria of a particular application.

The highly reflective mirror 204 may be disposed substantially collinear with and spaced apart from the partially-reflective mirror 202. In general, the reflective mirror 204 is configured to substantially reflect all light incident on the reflective mirror 204 toward the partially-reflective mirror 202. Accordingly, all or substantially all light (e.g., without regard to the frequency of oscillation of the light) reaching the reflective mirror 204 after entering the cavity via the partially-reflective mirror 202 may be directed back toward the partially-reflective mirror 202 via the reflective mirror 204. The reflective mirror 204 may comprise a plurality of quarter wave thick alternating layers of materials with suitably different index of refraction, but may also be fabricated using any appropriately partially reflective material to meet the design criteria of a particular application.

The active layer 206 is disposed substantially collinear with and between the partially-reflective mirror 202 and the reflective mirror 204 and absorbs a portion of the light propagating within the cavity in both forward and backward directions.

Partially-reflective mirror 202 once again partially transmits the light reflected by highly reflective mirror 204 when such light is incident on a second side of the partially-reflective mirror 202, excepting that portion of light oscillating at a resonant frequency which is substantially reflected back into the cavity. Accordingly, the partially-reflective mirror 202 may allow light to enter the resonant cavity while substantially prohibiting light oscillating at a resonant frequency from exiting the resonant cavity.

Resonance condition is achieved when the single pass optical path length of the cavity and the reflectivity of the partially-reflective mirror 202 are configured such that the total intensity of light reflected out of the cavity, equal to the sum of the reflected by mirror 202 portion of initial incident light and the successive transmitted by partially-reflective mirror 202 portions of backward propagating light, is minimized for light oscillating at a resonant frequency. This is also equivalent to maximizing the energy contained in the cavity of light oscillating at a selected frequency (i.e., the resonant frequency). Resonant cavity condition is generally met when the following two relationships are satisfied:

$L=(2m+1)\lambda/4$ (condition 1)

$r=\exp(-\alpha d)$ (condition 2)

where r is the amplitude reflectivity of the partially-reflective mirror 202, α is the absorption of the active layer 206, d is the thickness of the active layer 206, λ is the wavelength of illumination and m is equal to zero or a positive integer. These conditions correspond to the ideal case where the cavity has no intrinsic loss other than the absorption loss due to the active layer 206 and where mirror 204 is perfectly reflecting.

The first condition expresses the fact that the total reflectivity of the cavity is periodic with minima occurring for light frequencies such that the reflected by mirror 202 portion of initial incident light and the successive transmitted by partially-reflective mirror 202 portions of backward propagating light are mutually out of phase, and thus interfere destructively. The second condition expresses the fact that the reflectivity of partially-reflective mirror 202 can be configured such that the minima in the cavity reflectivity are substantially equal to zero.

As set forth above, light within the reflective cavity formed by mirrors 202 and 204 undergoes multiple reflections, with a resonant enhancement in the intensity of light oscillating at a frequency coincident or proximate to a resonant frequency of the cavity. Additionally, the two counter-propagating components of light within the cavity may interfere to form a standing wave, effectively causing the resonantly enhanced intensity of light to be further spatially modulated according to its position within the cavity.

In certain embodiments of the invention, the thickness of the active layer 206 is equal or greater than the modulation period of the spatial distribution of electric field, and the active layer 206 may be placed in any position within the resonant cavity.

In at least one other embodiment, the active layer 206 is positioned within the resonant cavity (i.e., at a point between the partially-reflective 202 and reflective 204 mirrors) coincident with a point corresponding to a maximum intensity of field amplitude of the standing wave, for generally increasing absorption of light oscillating at the resonant frequency, and thus the quantum efficiency of the pixel sensor 140a. Accordingly in the at least one other embodiment, a thinner active layer 206 may be implemented. Despite the lesser single pass absorption due to the reduced thickness of active layer 206, the localized enhancement of the field intensity results in a correspondingly enhanced effective absorption.

The active layer 206 may comprise any appropriate semiconductor material to meet the design criteria of a particular application, such as silicon for detection of light at visible wavelengths. GaN and associated compounds may also constitute a suitable active material for detection of blue light. For detection of light up to infrared wavelengths Si/Ge may be used. For detection at 1.5 microns, GaAs and alloys such as AlGaAs may be suitable candidates.

In general, the partially-reflective mirror 202, reflective mirror 204, active layer 206, spacer layer 208, and/or controllable index layer 210 may cooperate to form a resonant (i.e., reflective) cavity enhanced sensor 140a that is frequency selective (i.e., the active layer 206 absorbs at least a portion of light oscillating at a selected frequency). The selected frequency (i.e., resonant frequency) is generally a function of the length (i.e., L) of the resonant cavity. The length of the resonant cavity may be fixed or it may be tunable (i.e., modifiable, configurable, etc.).

One or more spacer layers 208 may be implemented between one or more elements of the sensor 140a. Such spacer layers 208 generally serve as intermediate layers and the quantity, length, thickness and/or placement of the one or more spacer layers 208 is adjusted to appropriately spatially separate and position the functional elements of the pixel sensor 140a and meet the design criteria for the optical path length of the resonant cavity, and therefore the selected frequency experiencing an enhanced detection efficiency.

As illustrated in FIG. 2, the pixel sensor 140a may optionally comprise a controllable index layer 210 fabricated from a suitable material with a controllable index of refraction. The controllable index layer 210 is generally configured to adjust (i.e., tune, control, modify, etc.) the resonant cavity length (L) of the sensor array 140a in response to an appropriate stimulus, such as an electrical stimulus. In at least one embodiment, the controllable index layer 210 may be manipulated via the stimulus and the optical path cavity length adjusted such that the cavity provides resonant detection at any target frequency of light comprised within a range of frequency.

As further illustrated in FIG. 2, the partially-reflective mirror 202, the reflective mirror 204, and the active layer 206 may be fabricated on a single chip, such as a CMOS chip.

Figure 3:
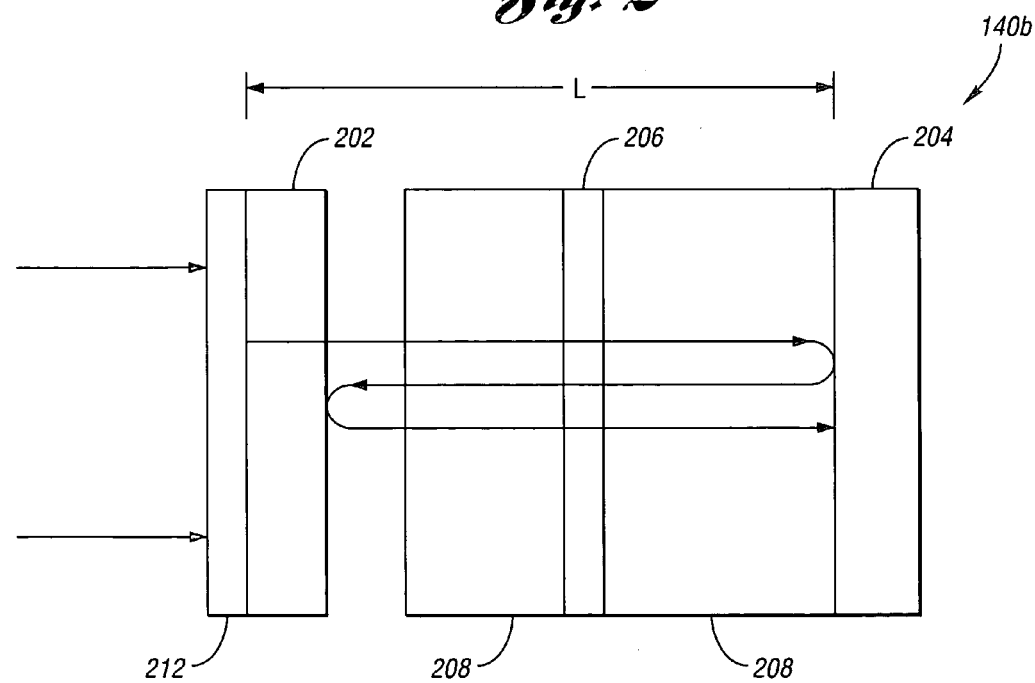
FIG. 3 is a schematic diagram of a sensor according to at least one other embodiment of the present invention.

Referring now to FIG. 3, a schematic diagram is provided of an individual pixel sensor 140b of a sensor array 142 according to at least one embodiment of the present invention. In general, the individual pixel sensor 140b of FIG. 3 may be implemented similarly to the individual pixel sensor 140a of FIG. 2 with the exception that the partially-reflective mirror 202 may comprise a separate mirror independent from the chip (i.e., spaced apart from chip) while the reflective mirror 204 and the active layer 206 may be fabricated on the single chip. In at least one embodiment, the partially-reflective mirror 202 may include an electrostatically controlled Micro Electro Mechanical Systems (MEMS) mirror disposed opposite and spaced apart from the chip.

Instead of using a controllable index layer 210 to adjust (i.e., tune, control, modify, etc.) the resonant cavity length (L) of the sensor array 140b (i.e., the controllable index layer 210 may be omitted from the embodiment shown in FIG. 3), an appropriate adjustment apparatus 212 may be implemented for adjusting at least one of angular orientation (e.g., tilt, rotation, and/or the like) and linear position of the partially-reflective mirror 202 with respect to the chip. Accordingly, in at least one embodiment, the partially-reflective mirror 202 may be manipulated via the adjustment apparatus 212 such that the resulting resonant cavity length corresponds to the selected frequency. For example, the partially-reflective mirror 202 may be adjusted such that the resonant cavity length (L) of the sensor array 140b equals $(2m+1)\lambda/4$ (i.e., $L=(2m+1)\lambda/4$), where m is equal to zero or a positive integer (e.g., 0, 1, 2, 3, . . . ), and λ is a wavelength of light to be detected.

With reference to FIGS. 2 and 3, several embodiments of the invention have been described which generally comprise incorporating the active area 206 of a pixel sensor 140 within a tunable frequency resonant cavity for resonantly enhancing its detection efficiency, and adjusting its resonant frequency to match that of the light to be detected. The frequency tunability and selectivity offered by the cavity's filtering properties may be advantageous for applications requiring frequency selective detection over a broad range of frequencies, such as telecommunications applications or spectroscopic applications.

In at least one embodiment of the invention, each pixel sensor 140 of a sensor array 142 may be configured to provide resonantly enhanced detection at a different frequency.

With regard to page-based optical storage, systems such as holographic data storage systems employing angular multiplexing for storing multiple page holograms may utilize frequency tuning of the readout illumination 130 to compensate for variations in readout conditions over its operating range. For example wavelength tuning of the light source 120 over several nm has been used to compensate for Bragg mismatch (i.e., changes in hologram properties requiring readout at specified conditions to become adjusted) and has been shown as an efficient way to extend the operating temperature range of such systems, as described for example in M. Toishi, T. Tanaka, M. Sugiki, K. Watanabe, "temperature tolerance improvement with wavelength tuning laser source in holographic data storage", Tera Bytes Memory Dev. Dept., Micro Systems Network Company, Sony Corporation, ThE5, ISOM/ODS '05 Proceedings. Furthermore other known multiplexing techniques, such as wavelength multiplexing, use light at different wavelengths (i.e., frequencies) to store and retrieve each of multiple page holograms.

Accordingly, it may be desirable for page based sensor arrays employed for page detection in holographic data storage systems to detect page image signals over a range of frequencies. This generally precludes the use of sensors arrays based on a fixed cavity length resonantly enhanced pixel sensor, as its fixed filtering properties may constitute a disadvantage in terms of limiting the frequency range of operation of the sensor.

Based on the above considerations, the one or more embodiments of the present invention may advantageously provide a resonant cavity enhanced pixel sensor with a tunable resonant frequency which may be used for detecting page image bearing light signals over a substantially broad range of frequencies.

Referring, now, to FIG. 4, a schematic diagram illustrating a pixel sensor 140c of a sensor array 142 according to at least one other embodiment of the present invention is shown. The pixel sensor 140c may be implemented similarly to the pixel sensor 140a of FIG. 2 with the exception that second reflective mirror 204 may be replaced with a partially-reflective mirror 404 and one or more additional elements (e.g., 206', 210', etc.) may be implemented. The partially-reflective mirror 202 is still generally configured to partially transmit light incident on a first side of the mirror 202.

In general, the second partially-reflective mirror 404 may be disposed substantially collinear with and spaced apart from the first partially-reflective mirror 202. However, the second partially-reflective mirror 404 may be configured to reflect light oscillating at a first frequency (e.g., the selected frequency) when the light oscillating at the first frequency is incident on a first side of the mirror 404, and transmit light not oscillating at the first frequency, when the light not oscillating at the first frequency is incident on either side of the mirror 404. Accordingly, the second partially-reflective mirror 404 may act as a frequency selective or dichroic filter, reflecting light oscillating at the first frequency toward the first partially-reflective mirror 202, while allowing light not oscillating at the first frequency to pass through. The first 202 and second 404 partially-reflective mirrors may be appropriately disposed to form a first cavity with a resonant frequency equal or substantially proximate to that of light oscillating at the first frequency.

A third partially-reflective mirror 404' may also be disposed substantially collinear with and spaced apart from the second partially-reflective mirror 404. In general, the third partially-reflective mirror 404' may be configured to reflect light oscillating at a second frequency when the light oscillating at the second frequency is incident on a first side of the mirror 404' and pass light not oscillating at the second frequency when the light not oscillating at the second frequency is incident on either side of the third partially-reflective mirror 404'. Accordingly, the third partially-reflective mirror 404' may act as a second frequency selective or dichroic filter, reflecting light oscillating at the second frequency toward the first partially-reflective mirror 202 while allowing light not oscillating at the second frequency to pass through. The first 404 and third 404' partially-reflective mirrors are appropriately disposed to form a second resonant cavity with a resonant frequency equal or substantially proximate to that of light oscillating at the second frequency.

As generally illustrated in FIG. 4, then, any appropriate number (p) of partially-reflective mirrors (e.g., 402, 404', 404" and the like), of absorbing layers (e.g., 206, 206', 206", and the like), and of spacer layers 208 of suitable thicknesses may be stacked to form (p−1) resonant cavities to meet the design criteria of a particular application. Each of the (p−1) resonant cavities generally share (i.e., have in common) the first partially-reflective mirror 202 and each may be tuned to selectively detect (i.e., absorb) light oscillating at a unique (i.e., different) frequency. For example, a first active layer 206 may be disposed substantially collinear with and between the first 202 and second 404 partially-reflective mirrors, and be substantially configured to absorb at least a portion of the light oscillating at the first frequency. Similarly, a second active layer 206' may be disposed substantially collinear with and between the second 404 and third 404' partially-reflective mirrors, and be configured to absorb at least a portion of the light oscillating at the second frequency.

In such an exemplary embodiment, the first 202, second 404, and third 404' partially-reflective mirrors may cooperate to de-multiplex (i.e., separate) a plurality of (e.g., a first and second) data page images that have been reconstructed using a plurality of different (e.g., a first and second) wavelengths.

In one exemplary embodiment, the sensor array 140c may further comprise first 210 and second 210' controllable index layers. In such an exemplary embodiment, the first controllable index layer 210 may be configured to adjust resonant cavity length (L1) between the first 202 and second 404 partially-reflective mirrors m response to a first stimulus, such as an electrical stimulus. Similarly, the second controllable index layer 210' may be configured to adjust resonant cavity length (L2) between the first 202 and third 404' partially-reflective mirrors in response to a second stimulus, such as a second electrical stimulus. However, any number of spacer layers 208 and/or controllable index layers 210 may be implemented to define an appropriate fixed or adjustable length for each of the (p−1) resonant cavities.

In at least one embodiment, an appropriate length (L1) between the first 202 and second 404 partially-reflective mirrors may be determined such that $L1=(2m+1)\lambda a/4$, where m is equal to zero or a positive integer and $\lambda a$ is a wavelength corresponding to the first frequency. Similarly, an appropriate length (L2) between the first 202 and third 404' partially-reflective mirrors may be determined such that $L2=(2n+1)\lambda b/4$, where n is equal to zero or a positive integer and $\lambda b$ is a wavelength corresponding to the second frequency.

As previously described in connection with FIG. 2, light oscillating at the various frequencies and circulating within the plurality of cavities form a plurality of standing waves, at least two or more of which generally extend in all but the longest cavity. Each standing wave has a resonantly enhanced light field spatially modulated according to its position within the cavity, with the maxima of field amplitude of each standing wave occurring generally at different positions due to their different frequencies. Accordingly, each of the at least one active layers 206, 206' (and the like) may be placed at a position coincident with a maximum field amplitude of a standing wave generated between the first partially-reflective mirror 202 and each of the partially-reflective mirrors 404, 404' (and the like), and comprises a active layer sufficiently thin such that it does not significantly coincide with the position of a maximum field amplitude of a different standing wave.

As illustrated in FIG. 4, the first 202, second 404, and third 404' partially-reflective mirrors, the first 206 and second 206' active layers, and the first 210 and second 210' controllable index layers may be fabricated on a single chip, such as a CMOS chip.

Accordingly, one or more embodiments of the present invention provide a pixel sensor 140 having increased detection efficiency, and sensor array 142 formed of a plurality thereof. One or more embodiments of the invention may also provide sensors 140 with increased bandwidth via implementation of a thinner active layer 206 while still providing an enhancement in detection efficiency. Furthermore, one or more embodiments of the present invention may provide, inter alia, a pixel sensor 140 for simultaneous selective detection of a plurality of signals at different wavelengths and, correspondingly, a sensor array 142 capable of simultaneously detecting a plurality of wavelength multiplexed image signals (i.e., data pages) in holographic storage.

Referring, now, to FIG. 5, a flow diagram of a method 500 for retrieving data in page-based optical data storage is shown. The method 500 may be advantageously implemented in connection with the system 100, described previously in connection with FIG. 1, the sensor 140a, described previously in connection with FIG. 2, and/or any appropriate apparatus or system to meet the design criteria of a particular application. In particular the method 500 may be implemented in connection with a logical device, such as a controller. The method 500 generally includes a plurality of blocks or steps that may be performed serially. As will be appreciated by one of ordinary skill in the art, the order of the blocks/steps shown in FIG. 5 is exemplary and the order of one or more block/step may be modified within the spirit and scope of the present invention. Additionally, the blocks/steps of the method 500 may be performed in at least one non-serial (or non-sequential) order, and one or more blocks/steps may be omitted to meet the design criteria of a particular application. Similarly, two or more of the blocks/steps of the method 500 may be performed in parallel.

At step 502, a light plane of modulated signals corresponding to data may be projected onto a first side of a partially-reflective mirror (e.g., 202) configured to transmit a portion of the light plane.

At step 504, the portion of the light plane transmitted by the partially-reflective mirror may be passed through an active layer (e.g., 206) such that a portion of light oscillating at a first frequency maybe absorbed by the active layer and light not absorbed by the active layer may be transmitted through the active layer. In general, the active layer is disposed substantially collinear with and spaced apart from the partially-reflective mirror.

At step 506, light transmitted through the active layer may be reflected back toward the active layer via a reflective mirror (e.g., 204) such that a second portion of the light oscillating at the first frequency may be absorbed by the active layer and light not absorbed by the active layer may be transmitted through the active layer toward the partially-reflective mirror. In general, the reflective mirror is disposed substantially collinear with and spaced apart from the active layer. Accordingly, in at least one embodiment, the partially-reflective and reflective mirrors may cooperate to form a reflective cavity. In such an embodiment, the first frequency may correspond to a resonant frequency of the reflective cavity. Similarly, in at least one embodiment, the partially-reflective and reflective mirrors may cooperate to form a reflective cavity having an optical path length such that the cavity exhibits substantially zero reflectivity at the first frequency.

In at least one embodiment, the method 500 may include the step of positioning the active layer at a position coincident with a first point corresponding to a maximum field amplitude of a first standing wave generated in the reflective cavity.

Similarly, in at least one embodiment, the method 500 may include the step of implementing a layer of controllable refractive index material (e.g., 210), having a refractive index configurable via an electrical stimulus, collinear with and between the partially-reflective mirror and the active layer. In such an embodiment, the method 500 may also generally comprise the step of generating the electrical stimulus to adjust the optical path length of the reflective cavity.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A sensor for page-based optical data storage, the sensor comprising:
   a first partially-reflective mirror having a first and second side, wherein the first partially-reflective mirror transmits a portion of light incident on the first side;
   a second partially-reflective mirror disposed substantially collinear with and spaced apart from the first partially-reflective mirror and having a first and second side, wherein the second partially-reflective mirror reflects light oscillating with a first frequency and transmits light not oscillating with the first frequency;
   a first active layer disposed substantially collinear with and between the first and second partially-reflective mirrors and configured to absorb at least a portion of the light oscillating with the first frequency;
   a third partially-reflective mirror disposed substantially collinear with and spaced apart from the second partially-reflective mirror and having a first and second side, wherein the third partially-reflective mirror reflects light oscillating with a second frequency and transmits light not oscillating with the second frequency; and
   a second active layer disposed substantially collinear with and between the second and third partially-reflective mirrors, and configured to absorb at least a portion of the light oscillating with the second frequency.

2. The sensor of claim 1 further comprising a first layer of controllable refractive index material having a first refractive index configurable via a first electrical stimulus for adjusting optical path length of a first reflective cavity formed between the first and second partially-reflective mirrors such that the first reflective cavity exhibits substantially zero reflectivity at the first frequency.

3. The sensor of claim 2 further comprising a second layer of controllable refractive index material having a second refractive index configurable via a second electrical stimulus for adjusting optical path length of a second reflective cavity formed between the first and third partially-reflective mirrors such that the second reflective cavity exhibits substantially zero reflectivity at the second frequency.

4. The sensor of claim 3 wherein the first, second and third partially-reflective mirrors, the first and second active layers, and the first and second layers of controllable refractive index material are fabricated on a single chip.

5. The sensor of claim 1 wherein the first active layer is disposed at a position coincident with a first point corresponding to a maximum field amplitude of a first standing wave generated between the first partially-reflective mirror and the second partially-reflective mirror, and the second active layer is disposed at a position coincident with a second point corresponding to a maximum field amplitude of a second standing wave generated between the first partially-reflective mirror and the third partially-reflective mirror.

* * * * *